(12) United States Patent
Forbes et al.

(10) Patent No.: US 7,606,448 B2
(45) Date of Patent: Oct. 20, 2009

(54) ZINC OXIDE DIODES FOR OPTICAL INTERCONNECTIONS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 11/717,770

(22) Filed: Mar. 13, 2007

(65) Prior Publication Data
US 2008/0226220 A1    Sep. 18, 2008

(51) Int. Cl.
*G02B 6/12*    (2006.01)
*H01L 21/00*   (2006.01)

(52) U.S. Cl. .......................................... 385/14; 438/31
(58) Field of Classification Search .................. None
See application file for complete search history.

(56) References Cited

U.S. PATENT DOCUMENTS

| 4,701,008 | A |   | 10/1987 | Richard et al. |
|---|---|---|---|---|
| 6,144,779 | A |   | 11/2000 | Binkley et al. |
| 6,150,188 | A | * | 11/2000 | Geusic et al. .................. 438/31 |
| 6,723,577 | B1 |   | 4/2004 | Geusic et al. |
| 6,829,421 | B2 |   | 12/2004 | Forbes et al. |
| 6,950,585 | B2 |   | 9/2005 | Forbes et al. |
| 7,132,691 | B1 |   | 11/2006 | Tanabe et al. |
| 7,194,176 | B2 |   | 3/2007 | Takahashi et al. |
| 7,233,710 | B2 |   | 6/2007 | Wang et al. |

| 2003/0015719 | A1 |   | 1/2003 | Haga |
|---|---|---|---|---|
| 2005/0247954 | A1 | * | 11/2005 | Niki et al. .................... 257/103 |
| 2006/0233969 | A1 |   | 10/2006 | White et al. |
| 2008/0226219 | A1 |   | 9/2008 | Forbes et al. |

FOREIGN PATENT DOCUMENTS

| EP | 0617314 A1 | 9/1994 |
|---|---|---|
| EP | 1054082 A1 | 11/2000 |
| JP | 63249383 | 10/1988 |
| JP | 2005333146 | 12/2005 |
| WO | WO 00/08691 | 2/2000 |
| WO | WO 00/45443 | 8/2000 |
| WO | WO 2004/106999 A1 | 12/2004 |

OTHER PUBLICATIONS

Adachi, Chihaya,et al. "Molecular design of hole transport materials for obtaining high durability in organic . . .". Appl. Phys. Lett. vol. 66, No. 20, (1995), 2679-2681.

Ataev,B.M., et al., "Synthesis of epitaxial layers of zinc oxide on nonorienting substrates". Technical Physics, vol. 44, No. 11 (1999), 1391-1393.

(Continued)

*Primary Examiner*—Michelle R Connelly Cushwa
(74) *Attorney, Agent, or Firm*—Brooks, Cameron & Huebsch, PLLC

(57) ABSTRACT

The present disclosure includes methods, devices, and systems for zinc oxide diodes for optical interconnections. One system includes a ZnO emitter confined within a circular geometry in an oxide layer on a silicon substrate. An optical waveguide is formed in the oxide layer and has an input coupled to the ZnO emitter. A detector is coupled to an output of the optical waveguide.

23 Claims, 5 Drawing Sheets

OTHER PUBLICATIONS

Bhattacharya, P., et al. "Fabrication of stable wide-band-gap ZnO/MgO multilayer thin films". App. Phys. Lett., vol. 83, No. 10 (2003), 2010-2012.

Bundesmann, C., et al. "Raman scattering in ZnO thin films doped with Fe, Sb, Al, Ga, and Li", App. Phys. Lett. vol. 83, No. 10 (2003), 1974-1976.

Cao, H., et al. "Random Laser Action in Semiconductor Powder". Physical Review Letters, vol. 82, No. 11 (1999), 2278-2281.

Cheng, X.M., et al. Magnetic properties of epitaxial Mn-doped ZnO thin films. Journal of App. Phys. vol. 93, No. 10 (2003), 7876-7878.

Coutal, C., et al. "Fabrication and characterization of ITO thin films deposited by excimer laser evaporation". Thin Solid Films, vol. 288 (1996), 248-253.

Endo, Kazuhiko, et al. "Metal organic atomic layer deposition of a high-k gate dielectrics using plasma oxidation". Jpn. Journal of App. Phys. vol. 42 (2003), 685-687.

Gustafsson, G., et al. "Flexible light-emitting diodes made from soluble conducting polymers". Nature, vol. 357 (1992), 477-479.

Hamberg, I., et al. "Evaporated Sn-doped In2O3 films: Basic optical properties and applications . . . ". Journal of App. Phys, vol. 60, No. 11 (1986), 123-159.

Kim, H., et al. "Indium tin oxide thin films for organic light-emitting devices". App. Phys. Lett. vol. 74, No. 23 (1999), 3444-3446.

Kim, T.S., et al., "Splitting of the Valence Band for Polycrystalline ZnO". Journal of the Korean Physical Society, vol. 38, No. 1 (2001), 42-46.

Ko, H.J., et al. "Photoluminescence properties of ZnO epilayers grown of CaF2 (111) by plama assisted . . .". App. Phys. Lett., vol. 76, No. 14 (2000), 1905-1907.

Kukli, Kaupo, et al. "Low-Temperature Deposition of Zirconium Oxide-Based Nanocrystalline . . . ", Chem. Vap. Deposition, vol. 6, No. 6 (2000), 297-302.

Liu, Z.F., et al. "Epitaxial growth and properties of Ga-doped ZnO films grown by pulsed laser deposition". Journal of Crystal Growth, vol. 259 (2003), 130-136.

Look, D.C. "Recent advances in ZnO materials and devices". Materials Science and Engineering, vol. 80 (2001), 383-387.

Lu, Y.F., et al. "The effects of thermal annealing on ZnO thin films grown by pulsed laser deposition". Journal of App. Phys., vol. 88, No. 1 (2000), 498-502.

Lv, Maoshui, et al. "Transparent conducting zirconium-doped zinc oxide films prepared by rf magnetron sputtering". Applied Surface Science, vol. 252, (2005), 2006-2011.

Makino, T., et al. "Exiton spectra of ZnO epitaxial layers on lattice-matched substrates grown with laser-molecular . . . ". App. Phys. Lett., vol. 76, No. 24 (2000), 3549-3551.

Minemoto, Takashi, et al. "Preparation of Zn1-xMgO films by radio frequency magnetron sputtering". Thin Solid Films, vol. 372 (2000), 173-176.

NCSR Web Author. "Zinc Oxide" http://www.onr.navy.mil/sci_tech/31/312/ncsr/materials/zno.asp, (2006) (6 pgs.).

Ohomoto, A., et al. "MgxZn1-xO as a II-IV widegap semiconductor alloy". App. Phys. Lett. vol. 72, No. 19, 2466-2468.

Pearton, S.J., et al. "Recent advances in processing of ZnO". J. Vac. Sci. Technol. vol. 22, No. 3 (2004), 932-948.

Putkonen, Matti, et al. "Enhanced growth rate in atomic layer epitaxy deposition of magnesium oxide thin films". J. Mater. Chem., vol. 10 (2000), 1857-1861.

Putkonen, Matti, et al. "Surface-controlled growth of magnesium oxide thin films by atomic layer epitaxy". J. Mater. Chem., vol. 9 (1999), 2449-2452.

Qadri,S.B., et al. "Electron Beam deposition of ZrO2-ZnO films". Thin Solid Films, vol. 290-291 (1996), 80-83.

Quadri, S.B., et al. "Transparent conducting films of . . . ", Thin Solid Films, vol. 377-378 (2000), 750-754.

Rajagopal, A., et al. "Photoemission spectroscopy investigation of magnesium-Alq3 interfaces". Journal of App. Phys., vol. 84, No. 1 (1998), 355-358.

Ryu,Y. R., et al. "Optical and structural properties of . . . ", Journal of Applied Physics, vol. 88, No. 1 (2000), 201-204.

Ryu, Yungryel, et al. "ZnO-based LEDs begin to show full-color potential". Compound Semiconductor, http://compoundsemiconductor.net/articles/magazine/12/8/3/1 (4 pgs.).

Sang, Baosheng, et al. "Growth of transparent conductive oxide ZnO Films by Atomic Layer Deposition". Jpn. J. App. Phys., vol. 35, (1996), 602-605.

Sanon, Geeta, et al. "Band-gap narrowing and band structure in degnerate tin oxide . . . ", Physical Review B, vol. 44, No. 11 (1991), 5672-5680.

Serneluis, B.E., et al. "Band-gap tailoring of ZnO by means of heavy Al doping". Physical Review B, vol. 37, No. 17 (1988), 10244-10248.

Shan, F.K., et al. "Band gap energy of pure and Al-doped ZnO thin films". Journal of the European Ceramic Society, vol. 24 (2004), 1869-1872.

Shan, F.K., et al. "Blueshift of near band edge emission in Mg doped ZnO thin films and aging". Journal of Applied Physics, vol. 95, No. 9 (2004), 4772-4776.

Shan, F.K., et al. "Optical properties As doped ZnO thin films prepared by pulsed . . . ". Journal of the European Ceramic Society, vol. 24 (2004), 1861-1864.

Shan, F.K., et al. "Optical properties of pure and Al doped ZnO thin films fabricated . . . ". Thin Solid Films, vol. 435 (2003), 174-178.

Shan, F.K., et al. "Structural properties of Zinc Oxide thin films by fabrication . . . ". Journal of the Korean Physical Society, vol. 42 (2003), 1157-1160.

Shan, F.K., et al. "Substrate effects of ZnO thin films prepared by PLD technique". Journal of the European Ceramic Society, vol. 24 (2004), 1015-1018.

Sneh, Ofer, et al. "Thin film atomic layer deposition equipment for semiconductor processing". Thin Solid Films, vol. 402 (2002),248-261.

So, Soon-Jin, et al. "Improvement in the electrical stability of semi-conducting ZnO . . . ". Journal of the Korean Physical Society, vol. 40, No. 5 (2002), 925-929.

Srikant, V., et al. "On the optical band gap of zinc oxide". Journal of Applied Physics, vol. 83, No. 10 (1998), 5447-5451.

Youm, Minsoo, et al. "Metal oxide semiconductor field effect transistor characteristics with . . . ". Jpn. J. Applied Physics, vol. 42 (2003), 5010-5013.

Yu, S.F., et al. "Design and Fabrication of Zinc Oxide Thin-Film Ridge Waveguides . . . ". IEEE Journal of Quantum Electronics, vol. 40, No. 4 (2004), 406-412.

Yu, S.F., et al. "Ultraviolet amplified spontaneous emission from zinc oxide ridge . . . ". App. Phys. Lett. vol. 83, No. 21 (2003), 4288-4290.

Yun, Sun Jin, et al. "Effects of plasma on characteristics of zirconium oxide films . . . ". Electrochemical and Solid-State Letters, vol. 8, No. 11 (2005), 47-50.

International Search Report (7 pgs.).

United States Patent and Trademark Office Action for U.S. Appl. No. 11/717,463, dated Mar. 25, 2008 (15 pgs.).

Applicant's Amendement and Response to USPTO Office Action dated Mar. 25, 2008, filed Apr. 29, 2008 (17 pgs.).

United States Patent and Trademark Office Action for U.S. Appl. No. 11/717,463, dated Aug. 4, 2008 (8 pgs.).

Applicant's Amendment and Response to USPTO Office Action dated Aug. 4, 2008, filed Sep. 3, 2008 (16 pgs.).

Han, Jiaping, et al. "Varistor behaviour of Mn-doped ZnO ceramics". Journal of the European Ceramic Society, vol. 22 (2002), 1653-1660.

Hatanpaa, Timo, et al. "Properties of [Mg2(thd)4] as a Precursor for Atomic Layer Deposition of MgO Thin Fims and Crystal . . . ". Chem. Mater., vol. 11 (1999), 1846-1852.

He, Yi, et al. "High-efficiency organic polymer light-emitting heterostructure devices on flexible plastics substrates". App. Phys. Lett., vol. 76, No. 6 (2000), 661-663.

Hirose,Y., et al. "Chemistry, diffusion and electronic properties of a metal/organic semiconductor . . . ". Appl. Phys. Lett., vol. 68, No. 2 (1996), 217-219.

Huang, R., et al. "The surface morphology of atomic layer deposited magnesia". Journal of Materials Science Letters, vol. 12 (1993), 1444-1446.

Ishibashi, S., et al., "Low resistivity indium-tin oxide transparent conductive films. II. Effect of sputtering . . . ", J. Vac. Sci. Technol., vol. 8, No. 3 (1990), 1403-1406.

Ishii, Hiroyuki, et al. "Growth and electrical properties of atomic-layer deposited ZrO2/Si-nitride . . . ". Journal of App. Phys., vol. 95, No. 2 (2004), 536-542.

Jeong, Sang-Hun, et al. "Photoluminescence dependence of ZnO films on Si (100) by radio-frequency . . . ". App. Phys. Lett. vol. 82, No. 16 (2003), 2625-2627.

Jonsson, A.K. et al. "Dielectric Permittivity and Intercalation Parameters of Li Ion Intercalated Atomic . . . ". Journal of the Electrochemical Society, vol. 151 (2004), 54-58.

Kim, H., et al. "Anode material based on Zr-doped ZnO thin films for organic light-emitting diodes". App. Phys. Lett. vol. 83, No. 18 (2003), 3809-3811.

* cited by examiner

US 7,606,448 B2

ZINC OXIDE DIODES FOR OPTICAL INTERCONNECTIONS

TECHNICAL FIELD

The present disclosure relates generally to semiconductor devices and, more particularly, to zinc oxide diodes for optical interconnections.

BACKGROUND

A continuing challenge in the semiconductor industry is to find new, innovative, and efficient ways of forming electrical connections with and between circuit devices which are fabricated on the same and on different wafers or dies. In addition, continuing challenges are posed to find and/or improve upon the packaging techniques utilized to package integrated circuitry devices.

One technique to alleviate these problems is optical interconnections between integrated circuits on the same die, adjacent die, or integrated circuits on a board. These interconnections can either be through air, optical waveguides or optical fibers. Since many integrated circuits include circuits formed from silicon based semiconductors, it would be desirable to use detectors also formed from silicon, e.g., a silicon photodiode or a metal-semiconductor-metal detector on silicon, etc. Such silicon based detectors have can only detect short wavelengths in the ultraviolet where silicon is strongly absorbing. Unfortunately, producing signals having such short wavelengths and accomplishing signaling implementations through appropriate waveguides to the detectors is more difficult to achieve.

DETAILED DESCRIPTION

Embodiments of the present disclosure include systems, methods, and devices for optical signaling. Embodiments include a Zinc Oxide (ZnO) emitter and a silicon detector in an optical interconnection. One method embodiment for forming a signal interconnect includes forming a ZnO emitter in an oxide layer on a semiconductor substrate. The method includes confining the ZnO emitter to a circular geometry in the oxide layer. The oxide layer can be an undoped oxide layer on a silicon substrate.

Forming the ZnO emitter includes defining a circular opening in the oxide layer on the silicon. An amorphous buffer layer of ZnO is deposited next to the silicon. Single crystalline ZnO is then grown on the buffer layer with p-type doping and then n-type doping. According to various embodiments, growing single crystalline ZnO on the buffer layer includes growing single crystalline ZnO using a hybrid beam deposition (HBD) process. Another embodiment can include growing the single crystalline ZnO on the buffer layer using a Metalorganic Chemical Vapor Deposition (MO-CVD) process. Another embodiment can include growing single crystalline ZnO using an atomic layer deposition (ALD) process.

One embodiment for an optical signal interconnect system includes a ZnO emitter in formed in an oxide layer on a first semiconductor substrate and confined within a circular geometry in the oxide layer. A silicon detector is formed on a second semiconductor substrate which is positioned to face the silicon detector opposite the ZnO emitter across an air gap.

In another embodiment, an optical signal interconnect system includes an optical waveguide formed in an oxide layer on a silicon substrate. A ZnO emitter is confined within a circular geometry in the oxide layer and coupled to an input of the optical waveguide. A detector is coupled to an output of the optical waveguide. In some embodiments, the optical waveguide is a Zinc Magnesium Oxide (ZnMgO) waveguide and the detector is a silicon photodiode detector. In some embodiments the optical waveguide is a hollow core photonic bandgap waveguide.

In various embodiments the ZnO emitter emits wavelengths of approximately 380 nm at a photon energy of approximately 3.3 eV. In these embodiments, the detector can be a silicon photodiode detector capable of receiving optical signals having a wavelength between 500 and 375 nanometers (nm).

Figure 1A:
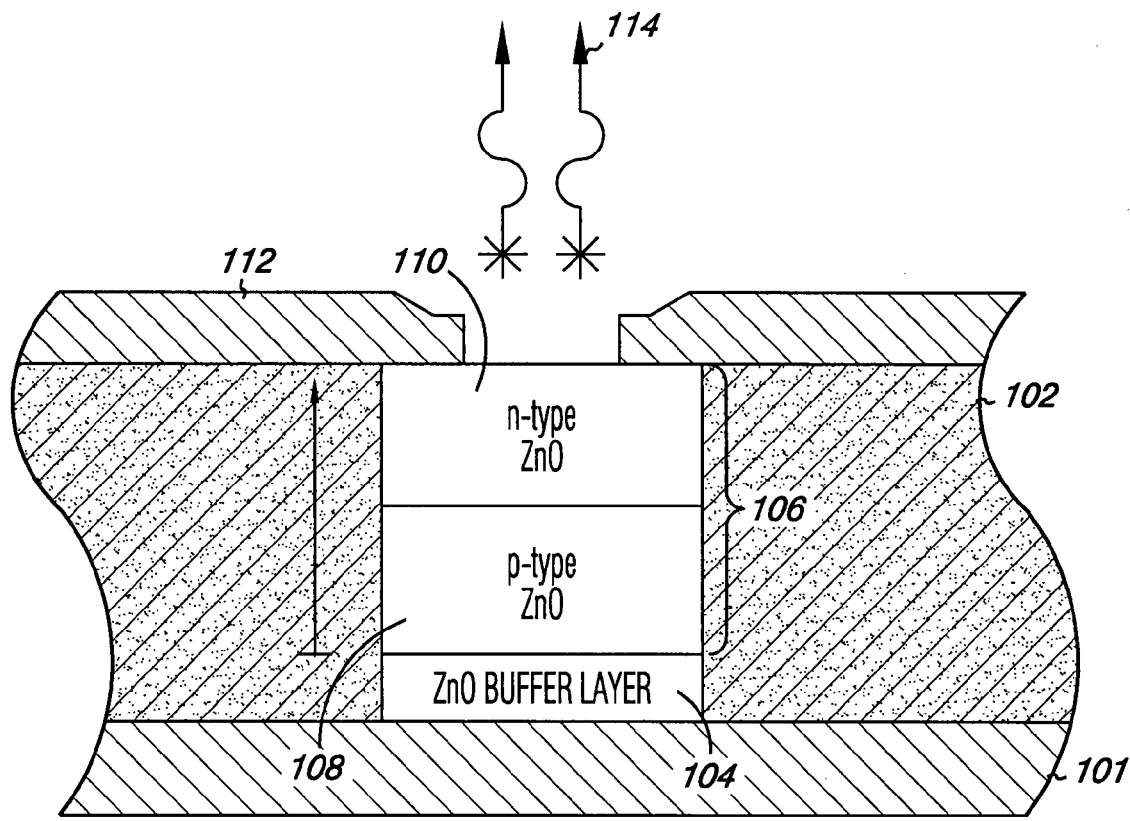
FIG. 1A illustrates a cross sectional view of an embodiment of a ZnO light emitting diode (LED) for use in optical interconnects with semiconductor integrated circuits (ICs).

FIG. 1A illustrates a cross sectional view of an embodiment of a ZnO light emitting diode (LED) for use in optical interconnects according to embodiments of the present disclosure. That is, the zinc oxide (ZnO) diode is confined within an opening in an undoped silicon dioxide ($SiO_2$) layer 102. The opening within the $SiO_2$ layer 102 has a circular geometry and can have a depth suited to a particular design scale for a particular integrated circuit, e.g. 50 nm. Embodiments, however, are not limited to this example depth. In the embodiment shown in FIG. 1A, the ZnO diode consists of a buffer layer 104 of ZnO, a p-type doped ZnO layer 108, and an n-type doped ZnO layer 110.

In various embodiments, the buffer layer 104 is an amorphous layer of ZnO. In various embodiments, the buffer layer 104 can have a thickness of 10 nm. Again, embodiments, however, are not limited to this example thickness. The buffer layer 104 can be deposited using chemical vapor deposition (CVD) or other techniques. The buffer layer 104 is deposited in the opening in the silicon dioxide. Next, single crystalline ZnO 106 is grown using a number of different techniques. The single crystalline ZnO 106 can be doped at different layers to form a p-type dopant layer 108 and an n-type dopant layer 110. By way of example, and not by way of limitation, the p-type dopant layer and the n-type dopant layer may each have similar or different thickness, e.g., 20 nm. Once again, embodiments are not limited to these example thicknesses.

In the circular confinement geometry of the $SiO_2$ layer 102, the crystal growth seeds from atoms of the amorphous buffer layer 104 of ZnO. The opening in the silicon oxide serves to provide optical confinement and increase the light emitting efficiency of the diode because of the differences in the indices of refraction in the ZnO diode and the $SiO_2$ substrate 102 and serves to promote single crystalline growth of the ZnO in the opening.

In various embodiments, the doped ZnO layers can be formed by individually growing the single crystalline ZnO to the appropriate depth and then doping the ZnO with the respective doping material. In such embodiments, the p-type doped layer 108 would be formed first. If this method is used, the second n-type doped layer 110 is formed on top of the p-type doped layer 108 in the same manner.

In some embodiments, the entire ZnO column 106 can be deposited and a p-type dopant, e.g., arsenic, can be ion implanted at a sufficiently high energy to dope only the bottom portion of the single crystalline ZnO. The doping of the ZnO is controlled by the energy level with which each doping material in driven into the ZnO column. The top portion of the single crystalline ZnO is then implanted with an n-type dopant, e.g. gallium, with a sufficiently high energy level.

Figure 1B:
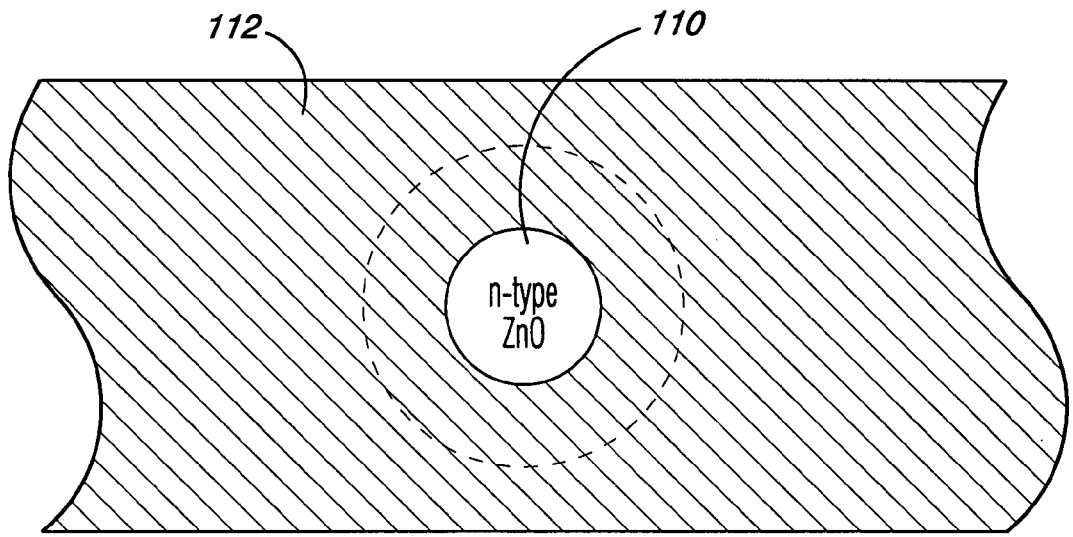
FIG. 1B illustrates an embodiment of a ZnO diode with a conductive contact to the ZnO diode such that the conductive contact defines a circular opening.

The single crystalline ZnO can be planarized, e.g., using chemical mechanical polishing (CMP) or other techniques. The diode is then capped with a conductor that defines a circular opening for the emission 114 of a signal from the ZnO diode. FIG. 1B shows the cap 112 formed of conductive material that defines a circular opening to generate the signal from the ZnO diode and allow emission of the optical signal from the diode.

In various embodiments, the ZnO diode, e.g., emitter, is formed on a semiconductor substrate 101, e.g., silicon. An oxide layer 102, e.g., $SiO_2$, is formed on the substrate 101 and an opening is formed in the oxide layer, e.g., using photolithographic techniques. The oxide layer can be formed to a suitable thickness according to the design rules of the device. According to various embodiments, photolithographic techniques are used to from a circular opening in the oxide to expose the substrate, e.g., silicon layer, underneath. The ZnO diode can be formed through irregular zinc oxide grains that are formed through the post-growth annealing of high-crystal-quality zinc oxide thin films obtained from a filtered cathodic vacuum technique. A hybrid beam deposition (HBD) process can be used to form the ZnO diode 100 in the $SiO_2$ substrate 102. This process offers a viable approach to growing doped and undoped ZnO films, alloys, and devices. The HBD process is comparable to molecular beam epitaxy (MBE); however, it uses a zinc oxide plasma source, which is produced by illuminating a polycrystalline ZnO target with either a pulsed laser or an electron beam and a high pressure oxygen plasma created by a radio-frequency oxygen generator.

A hybrid beam deposition (HBD) system utilizes a unique combination of pulsed laser deposition (PLD) technique and equipment that provides a radical oxygen rf-plasma stream to effectively increase the flux density of available reactive oxygen at a deposition substrate for the effective synthesis of metal oxide thin films. The HBD system further integrates molecular beam epitaxy (MBE) and/or chemical vapor deposition (CVD) techniques and equipment in combination with the PLD equipment and technique and the radical oxygen rf-plasma stream to provide elemental source materials for the synthesis of undoped and/or doped metal oxide thin films as well as synthesis of undoped and/or doped metal-based oxide alloy thin films.

A hybrid beam deposition system for synthesizing metal oxide films, doped metal oxide films, metal-based oxide alloy films, and doped metal-based oxide alloy films under predetermined synthesis conditions consists of a deposition chamber used as a containment chamber for synthesis of the metal oxide films, doped metal oxide films, metal-based oxide alloy films, and doped metal-based oxide alloy films under the predetermined synthesis conditions. A target assembly is used to mount a metal oxide target material within the deposition chamber and an rf reactive gas source introduces an rf oxygen plasma stream into the deposition chamber within a predetermined dynamical pressure range. A metal oxide plasma generating subsystem then interacts with the metal oxide target material to generate a high-energy directional metal oxide plasma plume within the deposition chamber. A source material subsystem generates, as required, one or more directed streams of elemental source materials into the deposition chamber for the synthesis of doped metal oxide films, metal-based oxide alloy films, and doped metal-based oxide alloy films and a substrate assembly positions. A substrate having a synthesis surface within the deposition chamber in such manner that the rf oxygen plasma stream, the high-energy directional metal oxide plasma plume, and the one or more directed streams of elemental source materials optimally are directed in selected combination or sequences at the synthesis surface of the substrate. This is done for the synthesis of metal oxide films, doped metal oxide films, metal-based oxide alloy films, and doped metal-based oxide alloy films on the substrate within the deposition chamber under the predetermined synthesis conditions.

In some embodiments, the ZnO diode can also be formed in the $SiO_2$ substrate 102 by metal organic chemical vapor deposition (MO-CVD). Firstly, a large amount of plasma energy is applied to the silicon substrate in a process for depositing a ZnO thin film by sputtering. Hydrogen is dissociated by this energy at low temperature as well as a thin film buffer layer, in which an amorphous material and fine crystals are mixed, is formed by easing the difference of lattice intervals between silicon and zinc oxide.

The system for depositing zinc oxide films by MO-CVD comprises a chamber containing a heated table, the introduction of the reactants into the chamber in gaseous form and a regulated pumping system to provide a dynamic gas flow through the chamber. An organozinc compound and oxidant are carried into the chamber in individual streams of an inert carrier gas. Mixing of the organozinc vapor and oxidant occurs before contact with the heated surface of the substrate in the space between the point of introduction thereof and the heated substrate surface. Reaction between the organozinc compound and oxidant results in decomposition of the organozinc compound to produce zinc oxide, which is deposited upon the substrate as a thin film, with $CO_2$, CO and volatile hydrocarbons as possible byproducts of the reaction. The zinc oxide film contains hydrogen and may contain a group III element where a volatile compound of a group III element is also introduced into the deposition chamber. Again, hydrogen is dissociated by this energy at low temperature as well as a thin film buffer layer, in which an amorphous material and fine crystals are mixed, is formed by easing the difference of lattice intervals between silicon and zinc oxide.

In various embodiments, the ZnO diode can also be formed in the SiO$_2$ substrate 102 by atomic layer deposition (ALD). ZnO films are grown by ALD using diethylzinc (DEZn) and H$_2$O as reactant gases. Self-limiting growth occurs at substrate temperatures ranging from 105° C. to 165° C. The self-limiting growth is also achieved when the flow rates of DEZn and H$_2$O were varied caused by the saturation of all the reaction and purging steps. It was found that the orientation and surface morphology of the films is strongly dependent on the substrate temperature. The mobility of films is higher than that of films grown by MO-CVD.

The ALD process begins by introducing gaseous precursors on at a time to the substrate surface, and between the pulses the reactor is purged with an inert gas or evacuated. In the first reaction step the precursor is saturatively chemisorbed at the substrate surface, and during the subsequent purging the precursor is removed from the reactor. In the second step, another precursor is introduced on the substrate and the desired film growth reaction takes place. After that the reaction byproducts and the precursor excess are purged out from the reactor. When the precursor chemistry is favorable, i.e. the precursor absorb and react with each other aggressively, on ALD cycle can be performed in less than one second in the properly designed flow type reactors.

Figure 2:
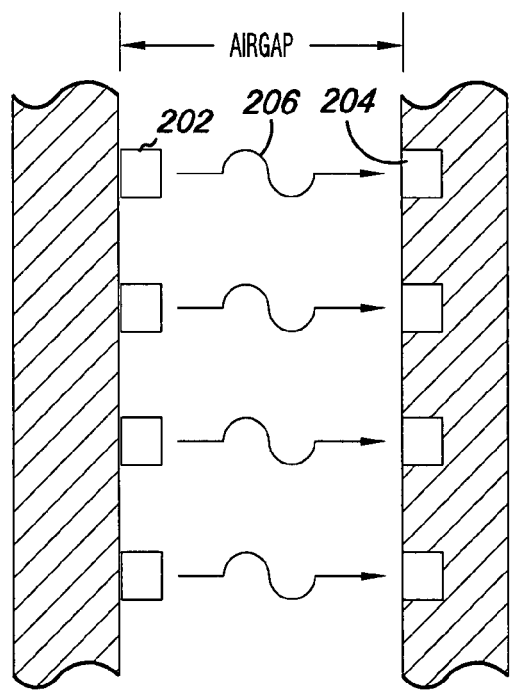
FIG. 2 illustrates an embodiment of a ZnO diode optically interconnected through an airgap to a silicon detector.

In the embodiment illustrated in FIG. 2, ZnO emitters 202 on a semiconductor surface of a first die or circuit are arranged to face the silicon detectors 204 on an adjacent die or circuit and communication is through a short air path 206. In operation the electrical contact provides an electrical current to the diode to excite electrons sufficiently to cause optical emission. In various embodiments, a sufficient current is provided to release photons having an energy of approximately 3.3 eV and a wavelength of 380 nm The ZnO emitter 202 emits a signal directionally through the air. The signal travels through the air over a short distance, which minimizes diffusion, to a silicon detector 204 where the signal can be received.

Figure 3:
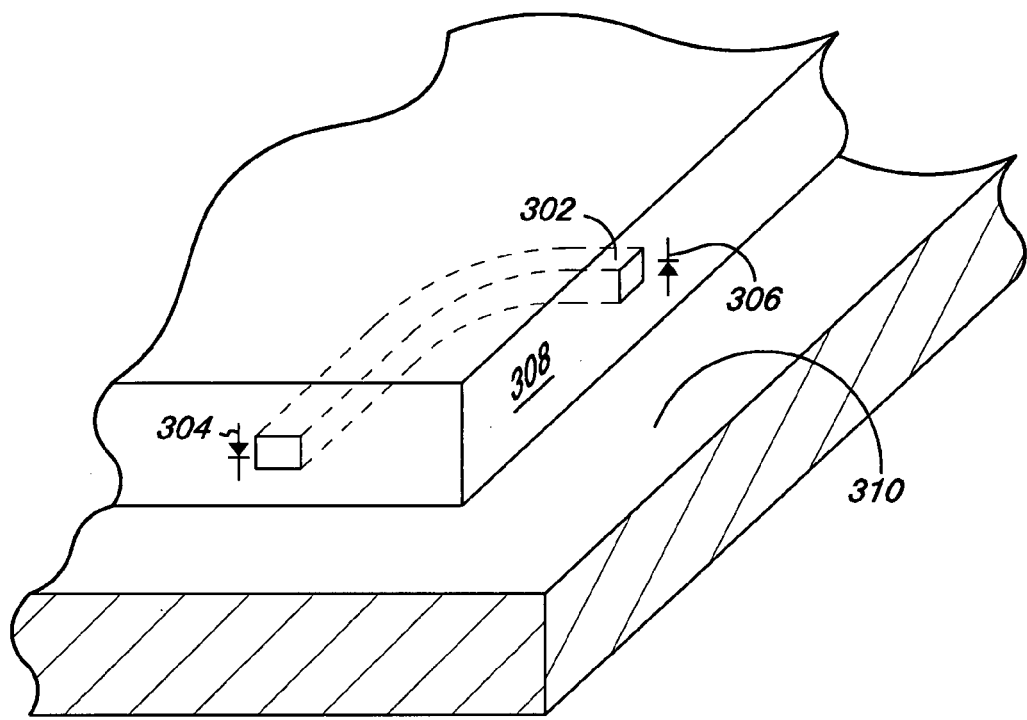
FIG. 3 illustrates an embodiment of a ZnO diode optically interconnected through a waveguide to a silicon detector.

FIG. 3 illustrates an embodiment that uses an optical waveguide 302, where the ZnO emitter 304 is at the sending end and the silicon detector 306 at the other receiving end. The ZnO optical waveguide 302 can receive a signal from an emitter 304 and transmit this signal through the waveguide 302 to a detector 306 that will receive the signal. According to various embodiments, the wavelengths of the signal emitters 304 will be less than the bandgap of ZnO where the ZnO material has a very low loss but can still be high enough that silicon detectors will have strong absorption.

The ZnO emitter 304 coupled to a ZnMgO waveguide 302 embedded in silicon oxide 308 on a silicon substrate 310 with integrated circuits. A silicon diode receiver 306 can be used at the output of the waveguide 302 to receive the optical signal and convert it back into an electrical signal to drive another part of the integrated circuit. According to various embodiments, the wavelength of the emission of the ZnO emitter 302 is less than the bandgap of the ZnMgO, but larger than the bandgap of the silicon, so it will be strongly absorbed by the silicon detector.

In embodiments in which a ZnO based emitter with a bandgap energy of 3.3 eV is used, light can be emitted at 380 nm and absorbed by a ZnO waveguide. In such embodiments, the ZnO can be doped with Mg to form a ZnMgO waveguide. This ZnMgO waveguide has a larger bandgap than ZnO and will not absorb at 380 nm making it a compatible waveguide for use with a ZnO emitter. If the ZnO diode is made in undoped material it will emit at 380 nm so the waveguide should have a larger bandgap and can be ZnMgO which will not absorb at 380 nm but rather only at shorter wavelengths, such as 310 nm. In some embodiments, the waveguides can be a hollow core photonic bandgap waveguide which will have no absorption and can be made in silicon oxide.

Figure 4A:
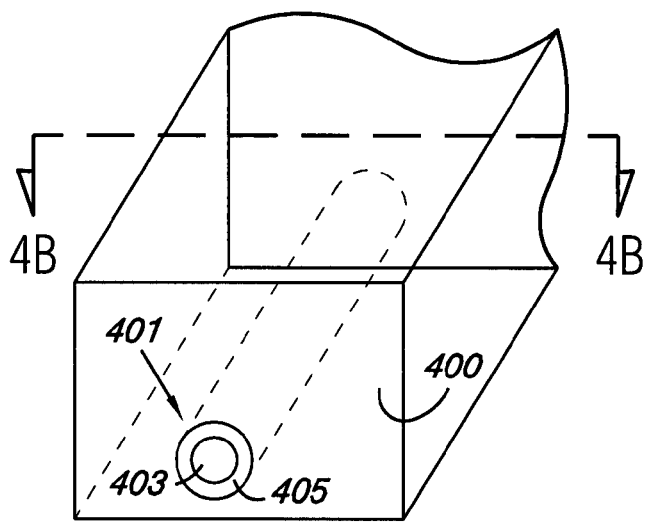
FIG. 4A illustrates an optical fiber waveguide with an inner core and outer cladding according to an embodiment of the present disclosure.

Other embodiments that use optical fibers for use with an optical emitter are illustrated in FIGS. 4A-8. In FIG. 4A the use of optical fibers 401 is shown, where the ZnO emitter is at one end and the silicon detector is at the other end. Again the fiber must be made of material which does not absorb the ultraviolet light. The core can be ZnO or ZnMgO and the cladding silicon oxide, which when used together do not absorb the light radiation and energy.

Several examples of optical waveguides and fibers shown in FIGS. 4-8 and described in the following paragraphs can be used to transmit the signal from the ZnO diode, e.g., the ZnO diode shown in FIG. 1A. In the embodiment shown in FIG. 4A, the optical fiber has a reflective layer that is formed on the inner surface of optical fiber 401. In one embodiment, the reflective layer comprises a metallic mirror that is deposited with a self-limiting deposition process. This produces a reflective surface for optical fiber 401 that is substantially uniform.

Figure 4B:
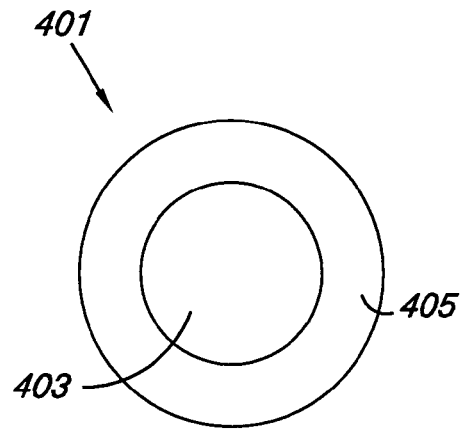
FIG. 4B illustrates a cross-sectional view of an optical fiber waveguide with an inner core and outer cladding according to an embodiment of the present disclosure.

In another embodiment of the present disclosure, FIG. 4B illustrates an optical fiber waveguide 401. The embodiment shown in FIG. 4B includes an optical fiber 401 that consists of a cladding layer 405 that separates the core 403 from the semiconductor wafer. In this structure, the semiconductor wafer acts as the outer sheath for optical fiber 401. Various materials can be used to form core 403 and cladding layer 405. The core 403 comprises a material with a higher index of refraction than the material of cladding layer 405 and thus provides normal optical fiber waveguide characteristics. Specific examples of materials for core 403 and cladding 405 are provided below with respect to FIGS. 4B and 5.

Figure 5:
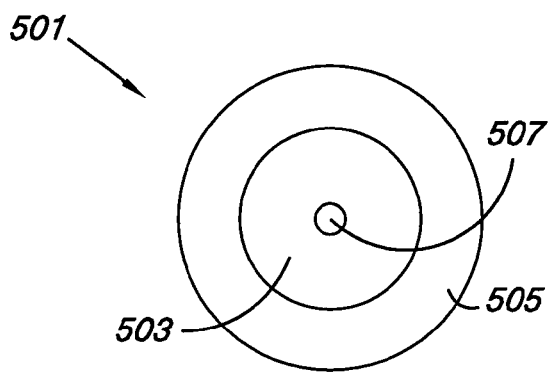
FIG. 5 illustrates a cross-sectional view of an optical fiber waveguide with an inner core, an outer cladding, and an opening through the center, according to an embodiment of the present disclosure.

In the embodiment illustrated in FIG. 5, optical fiber 501 comprises a cladding layer 505 that separates the core 503 from the semiconductor wafer. In this structure, the semiconductor wafer acts as the outer sheath for optical fiber 501. Various materials can be used to form core 503 and cladding layer 505. The core 503 comprises a material with a higher index of refraction than the material of cladding layer 505 and thus provides normal optical fiber waveguide characteristics. Also, an opening 507 runs through the length of the core 503. For example, when this opening has a diameter of less than approximately 0.59 times the wavelength of the light transmitted over the optical fiber 501 the light will still be guided by core 503.

Since the optical fiber is formed in a wafer of semiconductor material, absorption and radiation in the semiconductor wafer can affect the operation of the optical fiber. For example, if the wavelength of the light transmitted in optical fiber 401 is greater the absorption edge of the semiconductor wafer, e.g., 1.1 microns for silicon, then semiconductor wafer will not absorb the light transmitted in optical fiber 401. However, due to the large change in index of refraction at the interface between cladding layer 405 and the semiconductor wafer, some radiation loss occurs into the semiconductor wafer. This case is depicted, for example, in FIG. 6.

Figure 6:
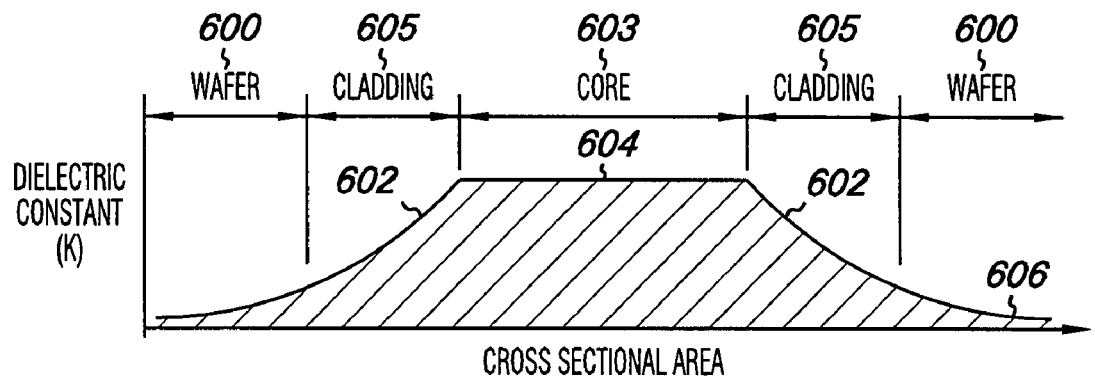
FIG. 6 illustrates the index of refraction across the cross section of the optical fiber waveguide of the embodiment shown in FIG. 4B.

FIG. 6 is a graph that illustrates the magnitude of the radiation for the embodiment of the optical fiber shown in FIG. 4. The graph in FIG. 6 shows the magnitude of radiation in an optical fiber, such as optical fiber 401 as shown in FIG. 4, along the diameter of the optical fiber. In the region of core 403, indicated at 604, optical waves are guided with no substantial loss along the length of optical fiber 401. Evanescent fields are present in the region of cladding layer 405 indicated at 602. These evanescent fields drop off to insignificant levels as indicated at 606 in the surrounding semiconductor wafer.

Figure 7:
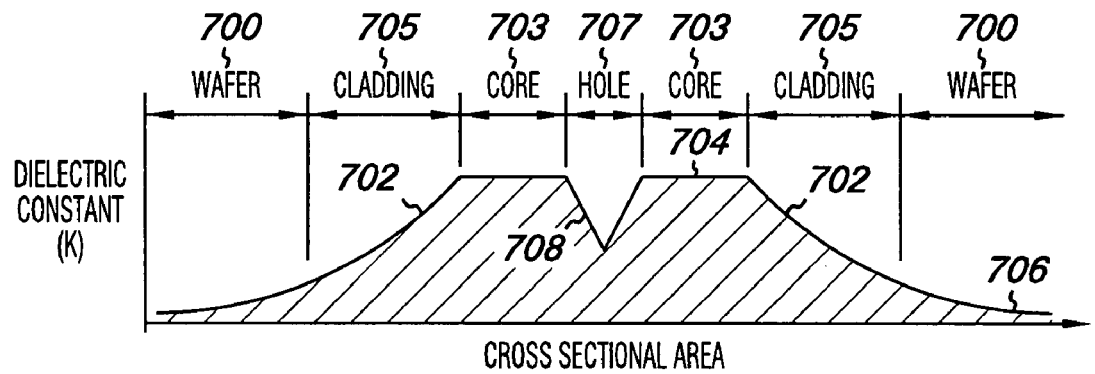
FIG. 7 illustrates the index of refraction across the cross section of the optical fiber waveguide of the embodiment shown in FIG. 5.

FIG. 7 is a graph that illustrates the magnitude of the radiation for the embodiment of the optical fiber shown in FIG. 5. The graph in FIG. 7 shows the magnitude of radiation in an optical fiber, such as optical fiber 501 shown in FIG. 5, along the diameter of the optical fiber. In the region of opening 507, an evanescent field is present as indicated at 708. In the region of core 503, radiation in the optical fiber is guided along the length of the fiber without significant loss in intensity as indicated at 704. Evanescent fields are present in the region of cladding layer 505 as indicated at 702. These evanescent fields drop off to insignificant levels as indicated at 706 in the surrounding semiconductor wafer.

Figure 8:
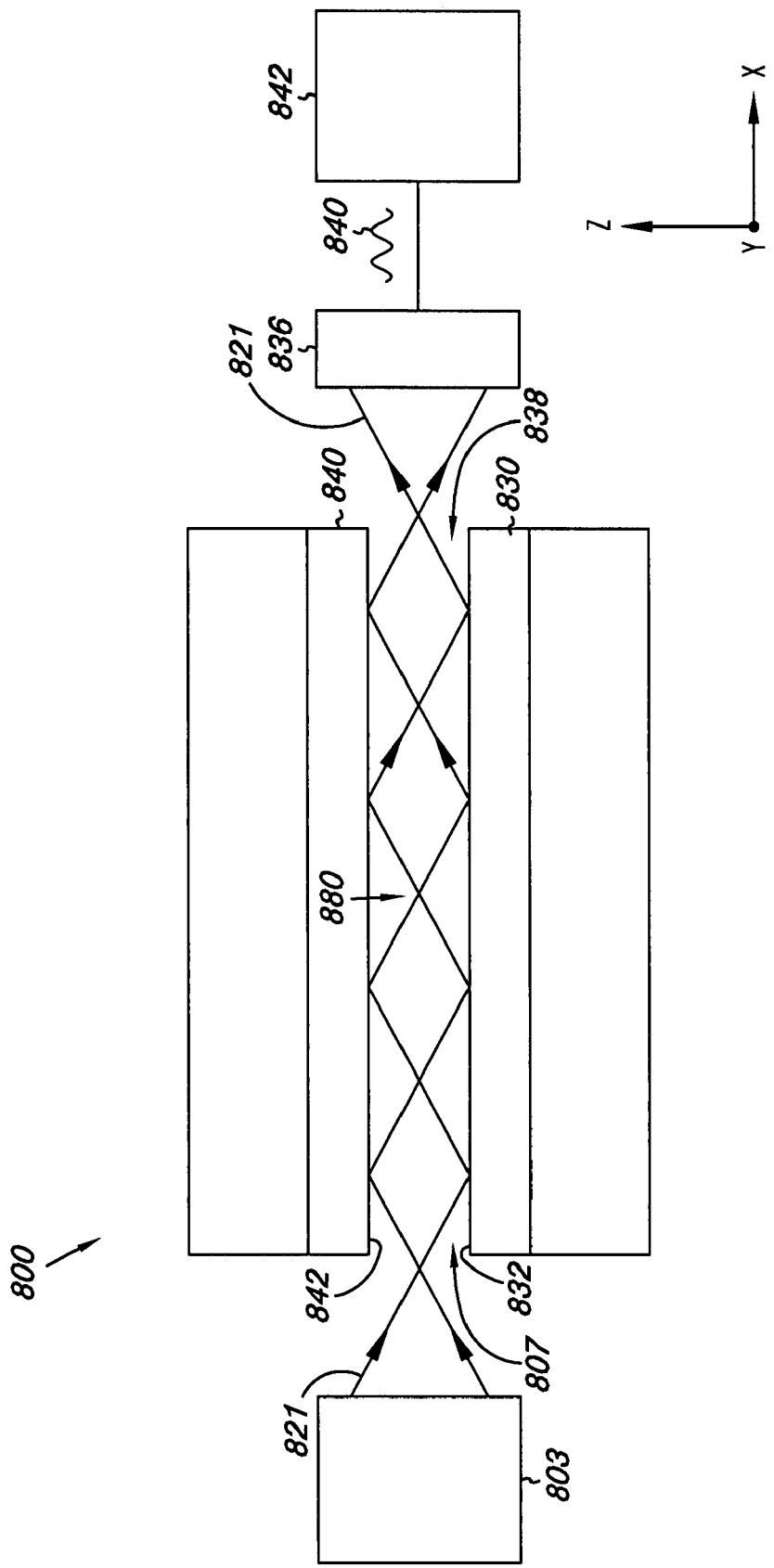
FIG. 8 illustrates an optical system including an emitter that sends a signal through a waveguide to a receiver according to embodiments of the present disclosure.

FIG. 8 illustrates an embodiment of an optical system that includes an emitter that sends a signal through a waveguide to a receiver. The embodiment in FIG. 8 shows waveguide optical system 801 that includes a radiation source 803 operatively coupled to an input end 807 of 3D photonic waveguide 880 so that radiation 821 emitted from the radiation source is transmitted down the waveguide. Radiation 821 has a wavelength within the photonic bandgap of 3D photonic crystal regions 830 and 840 that define waveguide 880. In an example embodiment, radiation source 803 includes embodiments of the ZnO diode described in connection with FIGS. 1A and 1B. In various embodiments, the source can be a ZnO diode according to the embodiments described herein.

Radiation 821 is confined in 3D over the entire range of possible propagation angles due to the omnidirectional reflection by each complete bandgap crystal surface e.g., lower channel wall 832, the channel sidewalls (not shown), and an upper surface 842 defining waveguide 880. Because waveguide 880 may contain either air, another gas (e.g., nitrogen) or a vacuum, the waveguide is expected to have a transmission loss comparable to or better than today's low loss fibers (0.3 dB per kilometer) used for long-distance optical communication. Also, bending losses from bends should be remarkably low as compared to conventional waveguides because the reflection mechanism of complete bandgap photonic crystals is not sensitive to incident angle. This allows for waveguide 880 to have bends of up to 90 degrees, providing more design latitude in fabricating waveguide-based integrated circuits optical systems such as couplers, Y-junctions, add-drop multiplexers, and the like.

In the embodiment of FIG. 8, a photodetector 836 is operatively coupled to an output end 838 of waveguide 880 to receive and detect radiation 821 having traveled down the waveguide, and to generate an electrical signal (i.e., a photocurrent) 840 in response thereto. Connected to photodetector 836 is an electronic system 842 operable to receive and process electrical signal 840.

The ZnO diode described in the above embodiments uses the opening in the silicon oxide to provide optical confinement and increase the light emitting efficiency of the diode because of the differences in the indices of refraction in the ZnO diode and the SiO substrate and serves to promote single crystalline growth of the ZnO in the hole.

CONCLUSION

Methods, devices, and systems for zinc oxide diodes for optical interconnects have been shown. The zinc oxide diode emits a signal to be received by a silicon detector.

In various embodiments, the zinc oxide diode has a ZnO buffer layer with a p-type ZnO As doped layer and a n-type ZnO Ga doped layer on top. The zinc oxide diode is formed while confined in the circular hole of silicon oxide to promote single crystalline growth, provide optical confinement, and increase the light emitting efficiency.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming an optical signal interconnect system, comprising:
    forming a light emitting diode in an undoped oxide layer on a silicon substrate, wherein forming the diode includes;
        forming an circular opening in the undoped oxide layer;
        depositing an amorphous buffer layer of Zinc Oxide (ZnO) on the silicon substrate within the circular opening;
        growing single crystalline ZnO on the buffer layer with p-type doping and then n-type doping; and
    providing a conductive contact to the n-type doping on the undoped oxide layer such that the conductive contact defines a circular opening.

2. The method of claim 1, wherein the method includes providing a metal conductive contact, wherein the circular opening to the conductive contact has a diameter which is less than a diameter of the circular opening in the undoped oxide layer.

3. The method of claim 1, wherein the method includes forming a silicon detector on a different substrate and facing the silicon detector opposite the light emitting diode across an air gap 4. The method of claim 1, wherein the method includes coupling the light emitting diode to an input of an optical waveguide.

5. The method of claim 4, wherein the method includes:
    coupling the light emitting diode to an input of a Zinc Magnesium Oxide (ZnMgO) waveguide; and
    coupling an output of the ZnMgO waveguide to a silicon photodiode detector.

6. The method of claim 4, wherein the method includes coupling the light emitting diode to an input of a hollow core photonic bandgap waveguide formed in silicon oxide.

7. The method of claim 6, wherein the method includes:
    coupling the light emitting diode to a hollow core photonic bandgap waveguide having a ZnO core; and coupling an output of the hollow core photonic bandgap waveguide to a silicon detector.

8. An optical signal interconnect system, comprising:
an optical waveguide formed in an oxide layer on a silicon substrate;
a single crystalline ZnO emitter confined within a circular geometry in the oxide layer, grown in the circular geometry using a hybrid beam deposition (HBD) process with p-type doping and then n-type doping over an amorphous buffer layer of ZnO in contact with the silicon substrate, and coupled to an input of the optical waveguide; and
a detector coupled to an output of the optical waveguide.

9. The interconnect system of claim 8, wherein:
the optical waveguide is a Zinc Magnesium Oxide (ZnMgO) waveguide; and
the detector is a silicon photodiode detector.

10. The interconnect system of claim 8, wherein the optical waveguide is a hollow core photonic bandgap waveguide.

11. The interconnect system of claim 8, wherein a metal conductive contact, with a circular opening that has a diameter which is less tan a diameter of the circular geometry in the oxide layer, couples the ZnO emitter to the input of the optical waveguide.

12. The interconnect system of claim 8, wherein the p-type doping includes Arsenic (As) doping and the n-type doping includes Gallium (Ga) doping.

13. The interconnect system of claim 8, wherein the ZnO emitter emits wavelengths of approximately 380 nm at a photon energy of approximately 3.3 eV.

14. The interconnect system of claim 8, wherein the detector is a silicon photodiode detector capable of receiving optical signals having a wavelength between 500 and 375 nanometers (nm).

15. An optical signal interconnect system, comprising:
a single crystalline ZnO emitter confined within a circular geometry in an oxide layer on a silicon substrate, grown in the circular geometry using a hybrid beam deposition (HBD) process with p-type doping and then n-type doping over an amorphous buffer layer of ZnO in contact with the silicon substrate;
an optical waveguide formed in the oxide layer and having an input coupled to the ZnO emitter;
a detector coupled to an output of the optical waveguide; and
wherein the ZnO emitter emits a wavelength having a photon energy which is less than a bandgap energy of the optical waveguide but larger than a bandgap energy of the detector.

16. The optical signal interconnect system of claim 15, wherein the optical waveguide is a Magnesium doped Zinc Oxide (MgZnO) waveguide.

17. A method for operating an optical signal interconnect system, comprising:
operating a single crystalline ZnO emitter confined within a circular geometry in an oxide layer on a silicon substrate grown in the circular geometry using a hybrid beam deposition (HBD) process with p-type doping and then n-type doping over an amorphous buffer layer of ZnO in contact with the silicon substrate to emit optical signals; and
using a silicon photodiode receiver to receive optical signals having a wavelength between 500 and 375 nanometers (nm).

18. The method of claim 17, wherein the method includes operating the ZnO emitter to emit ultraviolet optical signals.

19. The method of claim 17, wherein the method includes operating the ZnO emitter to emit optical signals having a wavelength of approximately 380 nm and a photon energy of approximately 3.3 eV.

20. The method of claim 17, wherein the method of operating includes coupling emissions from the ZnO emitter to an input of a MgZnO waveguide.

21. The method of claim 17, wherein the method of operating includes coupling emissions between the ZnO emitter and the silicon photodiode detector through an air gap.

22. The method of claim 17, wherein the method of operating includes coupling emissions from the ZnO emitter to an input of a hollow core photonic bandgap waveguide.

23. The method of claim 17, wherein the method includes using the silicon photodiode detector to detect optical signals optical signals and convert the optical signals to electrical signals.

* * * * *

UNITED STATES PATENT AND TRADEMARK OFFICE
CERTIFICATE OF CORRECTION

PATENT NO. : 7,606,448 B2 Page 1 of 1
APPLICATION NO. : 11/717770
DATED : October 20, 2009
INVENTOR(S) : Leonard Forbes et al.

It is certified that error appears in the above-identified patent and that said Letters Patent is hereby corrected as shown below:

In column 9, line 22, in Claim 11, delete "tan" and insert -- than --, therefor.

Signed and Sealed this

Twenty-ninth Day of December, 2009

David J. Kappos
*Director of the United States Patent and Trademark Office*